(12) United States Patent
Kawasumi

(10) Patent No.: US 10,832,743 B2
(45) Date of Patent: Nov. 10, 2020

(54) SEMICONDUCTOR STORAGE DEVICE HAVING A DRIVER THAT APPLIES VOLTAGE TO MEMORY CELLS BASED ON LOCATION OF MEMORY CELLS AND METHOD FOR CONTROLLING THE SAME

(71) Applicant: Toshiba Memory Corporation, Tokyo (JP)

(72) Inventor: Atsushi Kawasumi, Kawasaki Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/283,651

(22) Filed: Feb. 22, 2019

(65) Prior Publication Data

US 2019/0371368 A1 Dec. 5, 2019

(30) Foreign Application Priority Data

Jun. 5, 2018 (JP) .................................. 2018-107924

(51) Int. Cl.
| | | |
|---|---|---|
| G11C 5/06 | (2006.01) | |
| G11C 5/14 | (2006.01) | |
| G11C 5/02 | (2006.01) | |

(52) U.S. Cl.
CPC ................ *G11C 5/147* (2013.01); *G11C 5/02* (2013.01); *G11C 5/06* (2013.01)

(58) Field of Classification Search
CPC .. G11C 5/147; G11C 5/06; G11C 5/02; G11C 5/025; G11C 7/12; G11C 8/08; G11C 8/14; G11C 7/18; G11C 5/063

USPC ............................................................ 365/63
See application file for complete search history.

(56) References Cited

U.S. PATENT DOCUMENTS

| | | | |
|---|---|---|---|
| 5,917,770 A * | 6/1999 | Tanaka ..................... | G11C 8/00 345/100 |
| 9,218,886 B2 | 12/2015 | Dusija et al. | |
| 9,236,139 B1 | 1/2016 | Lai et al. | |
| 9,747,992 B1 | 8/2017 | Chen et al. | |
| 2010/0259962 A1 * | 10/2010 | Yan ........................ | B82Y 10/00 365/51 |
| 2011/0286283 A1 * | 11/2011 | Lung .................. | G11C 16/0483 365/185.28 |

\* cited by examiner

*Primary Examiner* — Tha-O H Bui
(74) *Attorney, Agent, or Firm* — Kim & Stewart LLP

(57) ABSTRACT

A semiconductor storage device includes first wiring lines extending in a first direction, second wiring lines extending in a second direction, memory cells at intersections of the first and second wiring lines. A selection unit concurrently selects, as selected memory cells, at least two memory cells that are between one of the first wiring lines and one of the second wiring lines and divided into a plurality of contiguous sections along the first wiring line, and a driver applies a voltage to selected memory cells through the first and second wiring lines. The at least two memory cells are located in the same section and the driver applies a first voltage when the selected memory cells are in a first section, and applies a second voltage, different from the first voltage, when the selected memory cells are in a second section.

20 Claims, 4 Drawing Sheets

US 10,832,743 B2

SEMICONDUCTOR STORAGE DEVICE HAVING A DRIVER THAT APPLIES VOLTAGE TO MEMORY CELLS BASED ON LOCATION OF MEMORY CELLS AND METHOD FOR CONTROLLING THE SAME

CROSS-REFERENCE TO RELATED APPLICATIONS

This application is based upon and claims the benefit of priority from Japanese Patent Application No. 2018-107924, filed Jun. 5, 2018, the entire contents of which are incorporated herein by reference.

FIELD

Embodiments described herein relate generally to semiconductor storage devices and methods for controlling the semiconductor storage device.

BACKGROUND

Some semiconductor storage devices concurrently select a plurality of memory cells that share a word line. Such a semiconductor storage device sometimes selects, for example, a memory cell located at the front end of a word line and a memory cell located at the rear end of the word line at the same time in order to minimize a voltage drop in the word line.

There is a concern that the above-described combination of the memory cells makes a voltage vary significantly between the selected memory cells. Large voltage variations can cause poor operation.

DETAILED DESCRIPTION

Embodiments provide a semiconductor storage device and a method for controlling the semiconductor storage device that can reduce large voltage variations between selected memory cells.

In general, according to one embodiment, a semiconductor storage device includes a plurality of first wiring lines extending in a first direction and arranged along a second direction that crosses the first direction so as to be parallel to each other, a plurality of second wiring lines extending in a third direction that crosses the first and second directions and arranged along the second direction so as to be parallel to each other, a plurality of memory cells provided at intersections of the plurality of first wiring lines and the plurality of second wiring lines, a selection unit configured to concurrently select, as selected memory cells, at least two memory cells of the plurality of memory cells that are each between one of the first wiring lines and one of the second wiring lines and are divided into a plurality of sections that are contiguous along the first wiring line, the sections including first and second sections, and a driver that applies a voltage to selected memory cells through the first wiring lines and the second wiring lines. The at least two memory cells are located in the same section and the driver applies a first voltage if the selected memory cells are in the first section and a second voltage, different from the first voltage, if the selected memory cells are in the second section.

Hereinafter, an embodiment will be described with reference to the drawings. The present embodiment is not intended to be limiting.

First Embodiment

Figure 1:
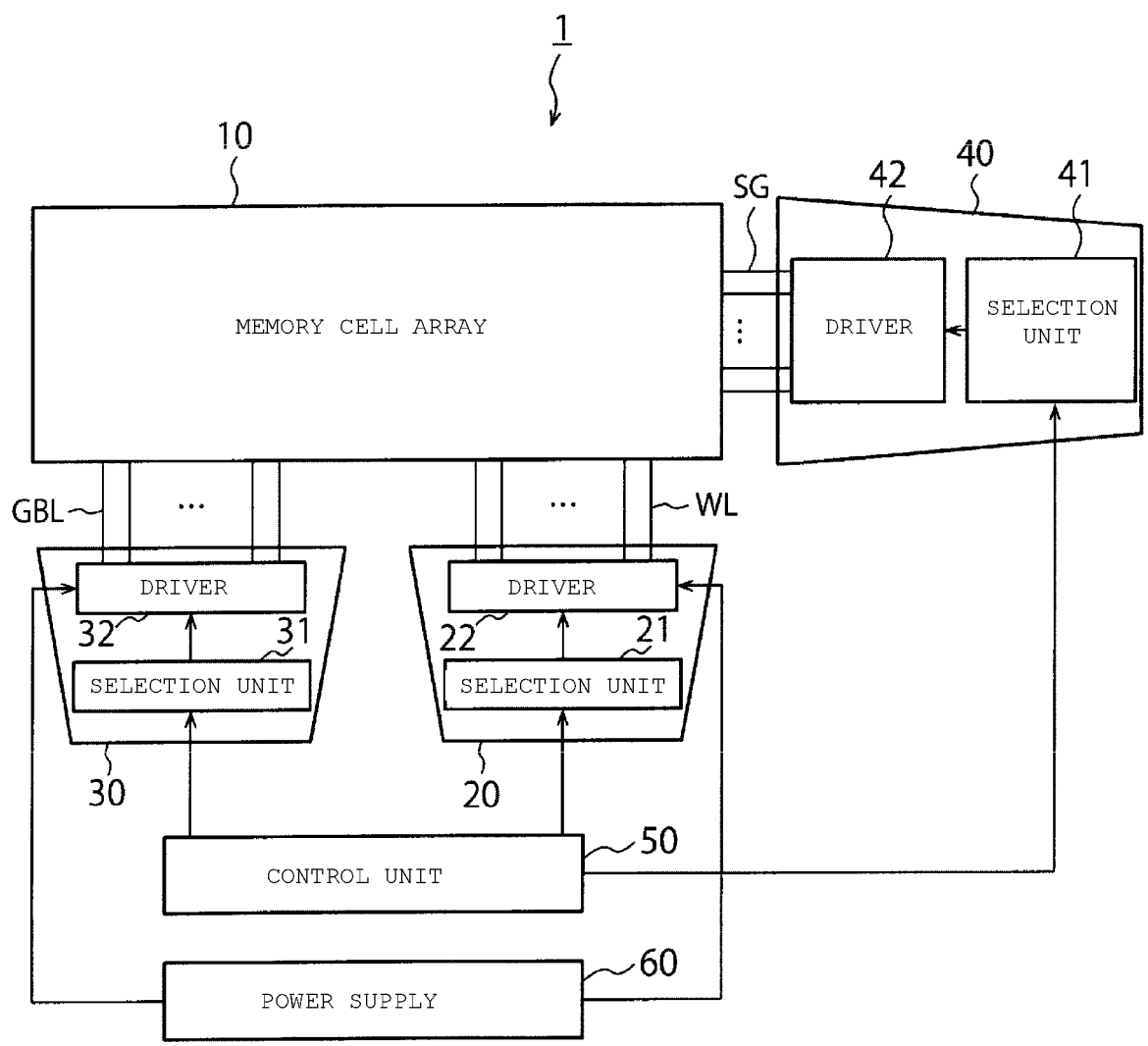
FIG. 1 is a block diagram depicting the schematic configuration of a semiconductor storage device according to a first embodiment.

FIG. 1 is a block diagram depicting the schematic configuration of a semiconductor storage device according to a first embodiment. A semiconductor storage device 1 depicted in FIG. 1 includes a memory cell array 10, a WL decoder 20, a GBL decoder 30, a selector decoder 40, a control unit 50, and a power supply 60.

Figure 2:
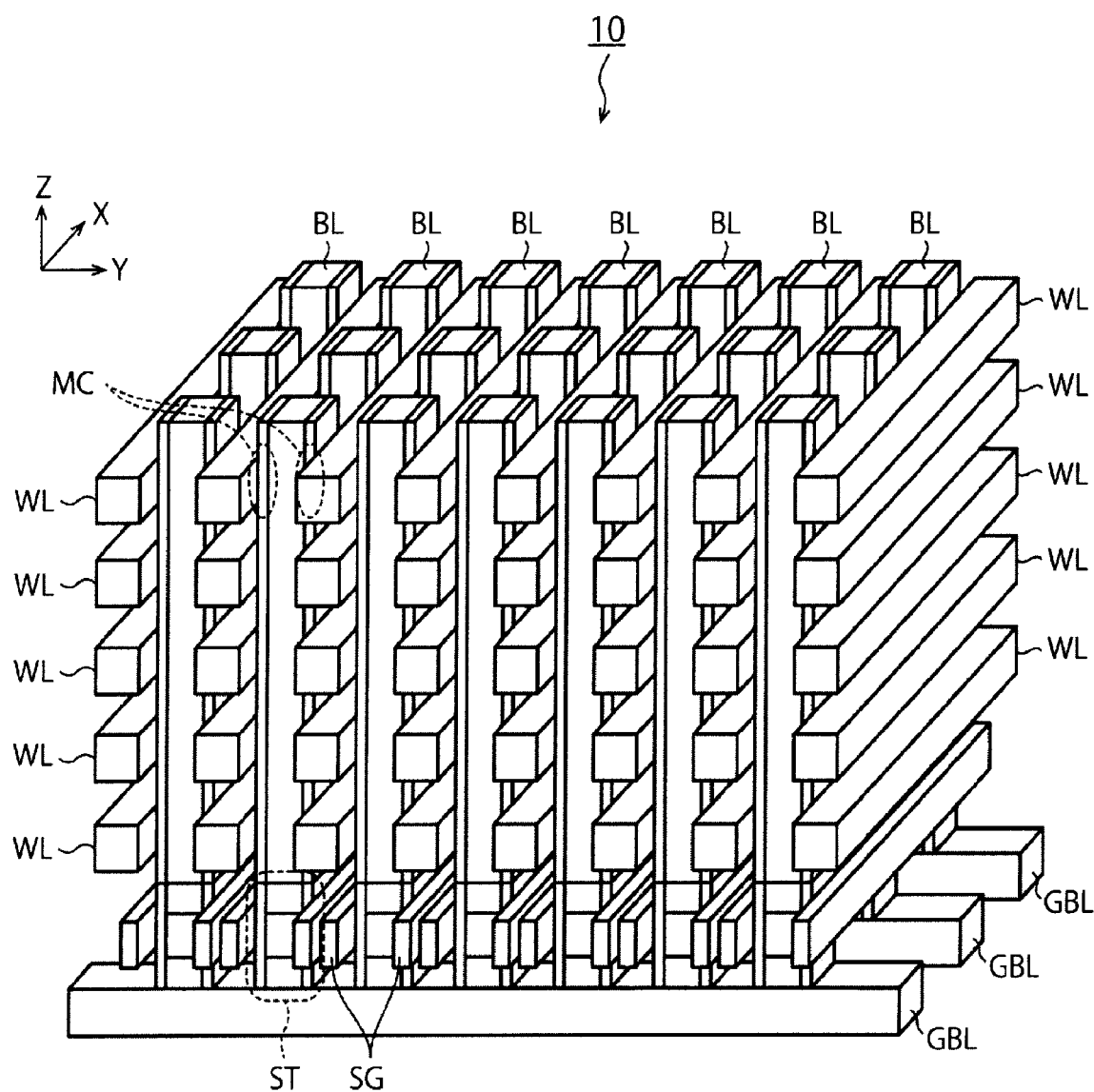
FIG. 2 is a perspective view of a memory cell array according to the first embodiment.

First, the memory cell array 10 will be described with reference to FIG. 2. FIG. 2 is a perspective view of the memory cell array 10.

In the memory cell array 10 depicted in FIG. 2, a plurality of memory cells MC are provided at the intersections of a plurality of word lines WL and a plurality of bit lines BL. Each memory cell MC is formed as a variable resistance memory device, for example.

The plurality of word lines WL extend in an X direction (i.e., a length direction) and are arranged so as to be parallel to each other along a Y direction and a Z direction, both of which are orthogonal to the X direction. The word lines WL are also referred to herein as first wiring lines.

The plurality of bit lines BL extend in the Z direction and are arranged between the plurality of word lines WL. One end of each bit line BL is connected to a global bit line GBL via a select transistor ST. The global bit line GBL extends in the Y direction. The bit line BL is also referred to herein as a first conductive line, and the global bit line GBL is also referred to herein as a second conductive line. Moreover, the first conductive line and the second conductive line are also referred to herein as second wiring lines.

The select transistor ST has the form of a thin-film transistor (TFT), for example. Moreover, the select transistor ST operates based on voltage which is applied to a selection gate SG extending in the X direction.

Here, referring back to FIG. 1, the WL decoder 20 will be described. The WL decoder 20 includes a selection unit 21 and a driver 22. The selection unit 21 is also referred to herein as a first selection unit, and the driver 22 is also referred to herein as a first driver.

When receiving, from the control unit 50, a word line address for identifying a selected memory cell, the selection unit 21 selects the word line WL based on the word line address. The driver 22 applies, to the selected word line and non-selected word lines, a voltage necessary for reading, writing, and erasing of data. This voltage is supplied from the power supply 60.

The GBL decoder 30 includes a selection unit 31 and a driver 32. The selection unit 31 is also referred to herein as a second selection unit, and the driver 32 is also referred to herein as a second driver.

When the selection unit 31 receives, from the control unit 50, a column address for identifying a selected memory cell, the selection unit 31 selects a global bit line GBL based on the column address. The driver 32 applies, to the selected global bit line and non-selected global bit lines, a voltage necessary for reading, writing, and erasing of data. This voltage is also supplied from the power supply 60.

The selector decoder 40 includes a selection unit 41 and a driver 42. When the selection unit 41 receives, from the control unit 50, a sheet address for identifying a selected memory cell, the selection unit 41 selects a selection gate SG based on the sheet address. The driver 42 applies, to the selected selection gate and non-selected selection gates, a voltage necessary for reading, writing, and erasing of data.

Hereinafter, an operation of the semiconductor storage device 1 according to the present embodiment will be described with reference to FIG. 3. In the following description, a memory cell MC selection operation will be explained.

Figure 3:
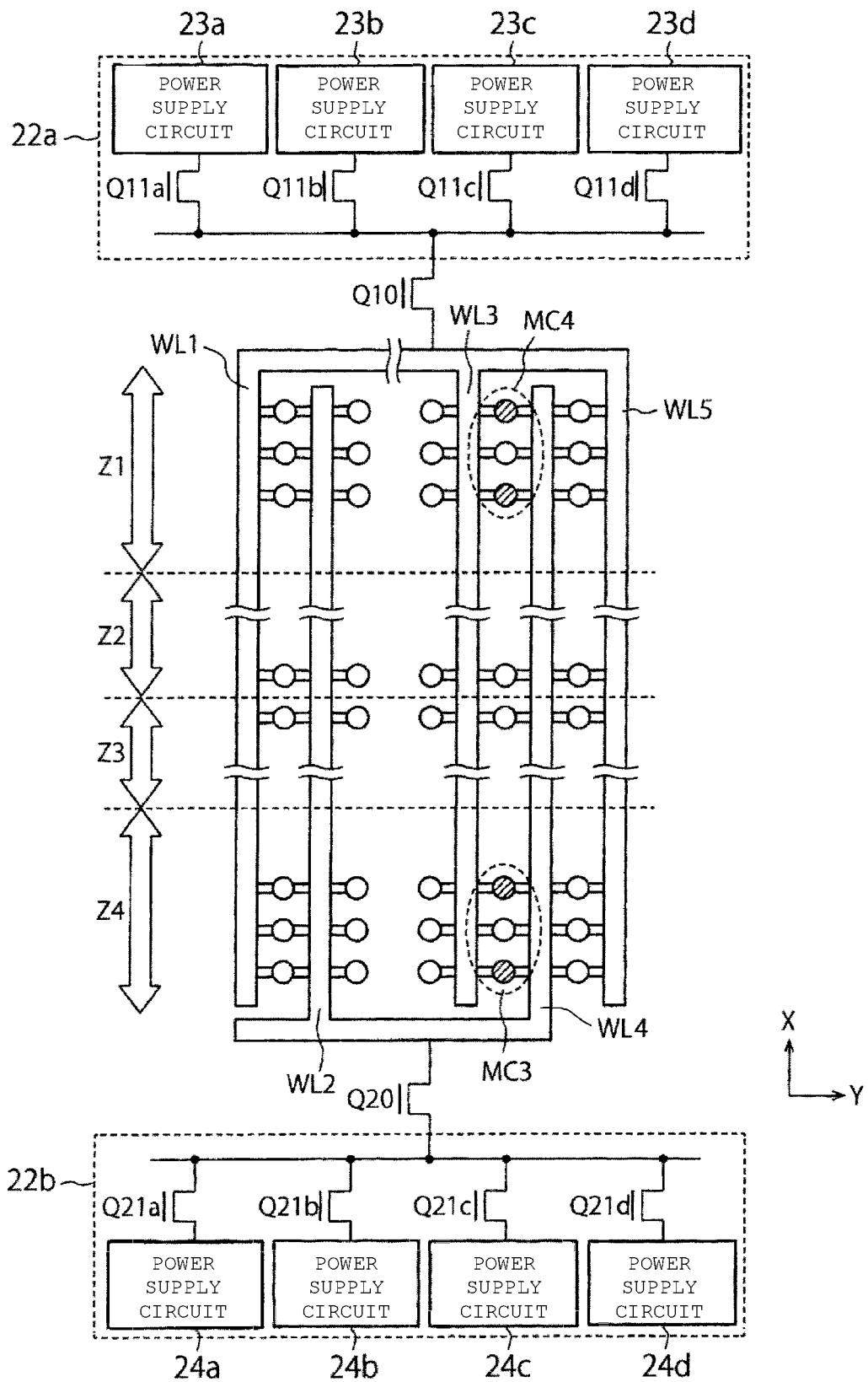
FIG. 3 is a plan view depicting the layout of word lines and memory cells of one layer of the memory cell array according to the first embodiment.

FIG. 3 is a plan view depicting the layout of the word lines and the memory cells of one layer. In the present embodiment, alternate word lines WL are connected together. In other words, odd-numbered word lines WL1, WL3, and WL5 and even-numbered word lines WL2 and WL4 are connected in the shape of two combs that mesh with each other. The number of word lines WL connected in the shape of one comb is not limited to a particular number.

The odd-numbered word lines WL1, WL3, and WL5 are connected to a driver 22a via a MOS transistor Q10. On the other hand, the even-numbered word lines WL2 and WL4 are connected to a driver 22b via a MOS transistor Q20. The driver 22a and the driver 22b are part of the above-described driver 22.

The driver 22a includes four power supply circuits 23a to 23d connected in parallel. MOS transistors Q11a to Q11d are connected in series to the power supply circuits. When one of the MOS transistors Q11a to Q11d is turned on, a voltage is output from the power supply circuit connected to the MOS transistor which was turned on.

Likewise, the driver 22b also includes four power supply circuits 24a to 24d connected in parallel. MOS transistors Q21a to Q21d are connected to the power supply circuits in series. When one of the MOS transistors Q21a to Q21d is turned on, a voltage is output from the power supply circuit connected to the MOS transistor which was turned on.

The power supply circuits 23a to 23d output different voltages by stepping up or down the voltage supplied from the power supply 60. The output voltages of the power supply circuits 23a to 23d correspond to four sections Z1 to Z4, respectively. The four sections Z1 to Z4 are sections obtained by division in the length direction X of the word lines WL. A voltage for each section is set so that the longer the current path from the driver 22a to the memory cell MC, the larger the voltage. The number of sections is not limited to a particular number.

In the present embodiment, the section Z4 including the front end portions of the word lines WL1, WL3, and W5 is located farthest from the driver 22a. Moreover, at least two or more memory cells MC disposed in the same section are concurrently selected. Thus, when, for example, memory cells MC3 disposed in the section Z4 of the word line WL3 are concurrently selected as the selected memory cells, the MOS transistor Q10 and the MOS transistor Q11d are turned on and the highest voltage is output from the power supply circuit 23d.

On the other hand, the output voltages of the power supply circuits 24a to 24d also correspond to the four sections Z1 to Z4, respectively. In the present embodiment, the section Z1 including the front end portions of the word lines WL2 and WL4 is located farthest from the driver 22b. Thus, when, for example, memory cells MC4 disposed in the section Z1 of the word line WL4 are concurrently selected as the selected memory cells, the MOS transistor Q20 and the MOS transistor Q21d are turned on and the highest voltage is output from the power supply circuit 24d.

According to the present embodiment, voltages which are applied to the memory cells MC are selected based on the length of the current path from the driver 22, in other words, the magnitude of a voltage drop. Moreover, a plurality of memory cells disposed in the same section are concurrently selected. In the same section, variations in the voltages which are applied to the memory cells are small. This makes it possible to prevent voltage variations between the selected memory cells and avoid poor operation.

The driver 22a and the driver 22b for the word lines are not limited to the configuration including a plurality of power supply circuits, which is depicted in FIG. 3, and in alternative embodiments, only need to have a function that allows the driver 22a and the driver 22b to output different voltages depending on the sections. Moreover, the plurality of power supply circuits depicted in FIG. 3 may be provided in the driver 32 for the bit lines. In this case, the output voltage of each power supply circuit is set in accordance with the position of a layer. Specifically, the higher a level in which a layer is located, the higher the set voltage.

Modified Example

Figure 4:
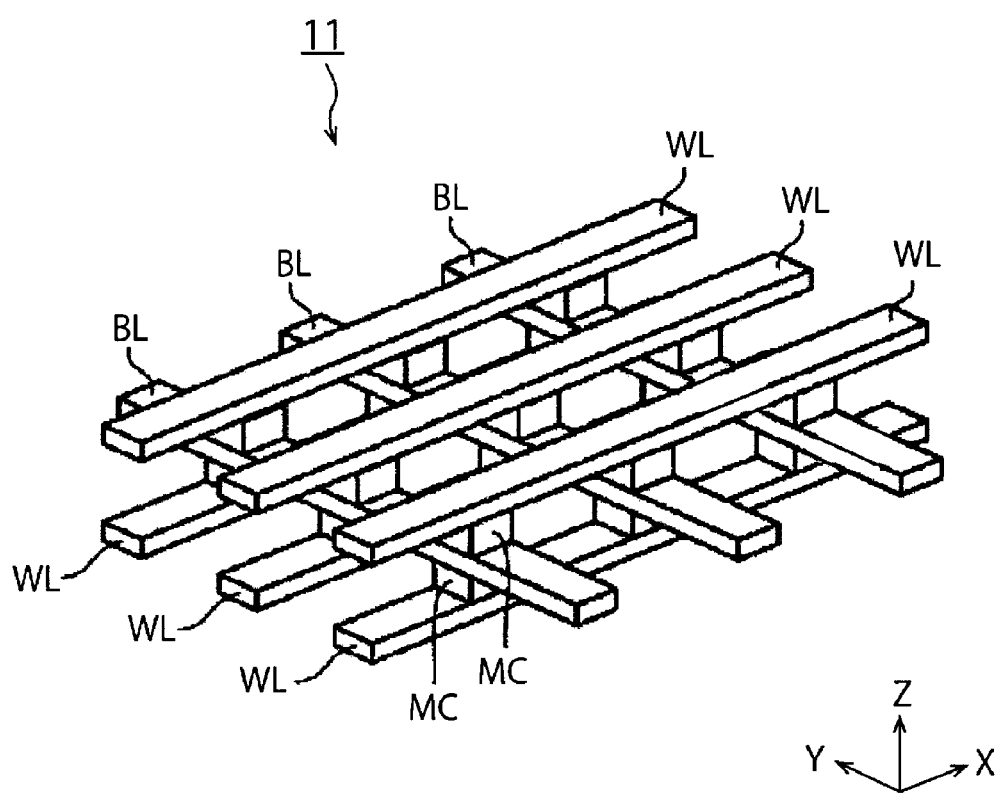
FIG. 4 is a perspective view of a memory cell array according to a modified example.

FIG. 4 is a perspective view of a memory cell array according to a modified example. Hereinafter, only a difference from the above-described first embodiment will be described and explanations of similar matters will be omitted.

A memory cell array 11 according to this modified example is a so-called cross-point type memory cell array in which a plurality of word lines WL and a plurality of bit lines BL are alternately stacked. Also in this modified example, as in the case of the first embodiment, the driver 22 outputs a voltage to each word line WL. Moreover, the output voltage of the driver 22 is set for each of sections obtained by dividing in the length direction X of the word lines WL. Furthermore, the selection unit 21 selects, as the selected memory cells, at least two or more memory cells MC disposed in the same section.

Thus, even with a semiconductor storage device with a cross-point type memory cell array, it is possible to prevent voltage variations between the selected memory cells and avoid poor operation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor storage device comprising:
a plurality of first wiring lines extending in a first direction and arranged along a second direction that crosses the first direction so as to be parallel to each other;
a plurality of second wiring lines extending in a third direction that crosses the first and second directions and arranged along the second direction so as to be parallel to each other;

a plurality of memory cells provided at intersections of the plurality of first wiring lines and the plurality of second wiring lines;

a selection unit configured to concurrently select, as selected memory cells, at least two memory cells of a plurality of memory cells that are each between one of the first wiring lines and one of the second wiring lines and are divided into a plurality of sections that are contiguous along the first wiring line, the sections including first and second sections; and a driver that applies a voltage to selected memory cells through the first wiring lines and the second wiring lines, wherein said at least two memory cells are located in the same section and the driver applies a first voltage when the selected memory cells are in the first section and a second voltage, different from the first voltage, when the selected memory cells are in the second section.

2. The semiconductor storage device according to claim 1, wherein the first voltage is higher than the second voltage when the first section is farther from the driver than the second section.

3. The semiconductor storage device according to claim 1, wherein
the selection unit includes a first selection unit that selects a first selected wiring line corresponding to the selected memory cells from the plurality of first wiring lines, and a second selection unit that selects a second selected wiring line corresponding to the selected memory cells from the plurality of second wiring lines, and
the driver includes a first driver that varies a voltage applied to the first selected wiring line and a second driver that varies a voltage applied to the second selected wiring line.

4. The semiconductor storage device according to claim 3, wherein
the first driver includes a plurality of power supply circuits connected in parallel, and
each of the plurality of power supply circuits outputs the voltage set for one of the plurality of sections.

5. The semiconductor storage device according to claim 4, wherein the voltage set for the first section is the first voltage and the voltage set for the second is the second voltage.

6. The semiconductor storage device according to claim 5, wherein
the plurality of first wiring lines are connected in a shape of a comb.

7. The semiconductor storage device according to claim 1, further comprising:
a plurality of third wiring lines extending in the second direction and connected to one end of the plurality of the second wiring lines in the third direction.

8. The semiconductor storage device according to claim 7, wherein the second wiring lines are each arranged between two first wiring lines that are adjacent.

9. The semiconductor storage device according to claim 8, wherein the first wiring lines are word lines, the second wiring lines are bit lines, and the third wiring lines are global bit lines.

10. A semiconductor storage device comprising:
a plurality of first wiring lines extending in a first direction and arranged along a second direction that crosses the first direction so as to be parallel to each other;
a plurality of second wiring lines extending in the second direction and arranged along the first direction so as to be parallel to each other;

a plurality of memory cells provided at intersections of and between the plurality of first wiring lines and the plurality of second wiring lines;

a selection unit configured to concurrently select, as selected memory cells, at least two memory cells of a plurality of memory cells that are each between one of the first wiring lines and one of the second wiring lines and are divided into a plurality of sections that are contiguous along the first wiring line, the sections including first and second sections; and a driver that applies a voltage to selected memory cells through the first wiring lines and the second wiring lines, wherein said at least two memory cells are located in the same section and the driver applies a first voltage when the selected memory cells are in the first section and a second voltage, different from the first voltage, when the selected memory cells are in the second section.

11. The semiconductor storage device according to claim 10, wherein the first voltage is higher than the second voltage when the first section is farther from the driver than the second section.

12. The semiconductor storage device according to claim 10, wherein
the selection unit includes a first selection unit that selects a first selected wiring line corresponding to the selected memory cells from the plurality of first wiring lines, and a second selection unit that selects a second selected wiring line corresponding to the selected memory cells from the plurality of second wiring lines, and
the driver includes a first driver that varies a voltage applied to the first selected wiring line and a second driver that varies a voltage applied to the second selected wiring line.

13. The semiconductor storage device according to claim 12, wherein
the first driver includes a plurality of power supply circuits connected in parallel, and
each of the plurality of power supply circuits outputs the voltage set for one of the plurality of sections.

14. The semiconductor storage device according to claim 13, wherein the voltage set for the first section is the first voltage and the voltage set for the second is the second voltage.

15. The semiconductor storage device according to claim 14, wherein
the plurality of first wiring lines are connected in a shape of a comb.

16. The semiconductor storage device according to claim 10, further comprising:
a plurality of third wiring lines extending in the first direction and connected to one end of the plurality of the second wiring lines in the third direction.

17. The semiconductor storage device according to claim 16, wherein the first wiring lines are word lines, and the second wiring lines are bit lines.

18. A method for controlling a semiconductor storage device including a plurality of first wiring lines extending in a first direction and arranged along a second direction that crosses the first direction so as to be parallel to each other, a plurality of second wiring lines extending in a third direction that crosses the first and second directions and arranged along the second direction so as to be parallel to each other, and a plurality of memory cells provided at intersections of the plurality of first wiring lines and the plurality of second wiring lines, the method comprising:

concurrently selecting, as selected memory cells, at least two memory cells from a plurality of memory cells that are each between one of the first wiring lines and one of the second wiring lines and are divided into a plurality of sections that are contiguous along the first wiring line, the sections including first and second sections; and applying a first voltage when the selected memory cells are in the first section and a second voltage, different from the first voltage, when the selected memory cells are in the second section, wherein said at least two memory cells are located in the same section.

19. The method according to claim 18, wherein the first voltage is higher than the second voltage when the first section is farther from the driver than the second section.

20. The method according to claim 18, further comprising:

generating different voltages through a plurality of power supply circuits connected in parallel, wherein each of the plurality of power supply circuits outputs the voltage set for one of the plurality of sections.

\* \* \* \* \*